US012660342B2

(12) United States Patent
   Katase

(10) Patent No.: US 12,660,342 B2
(45) Date of Patent: Jun. 16, 2026

(54) ELECTRONIC COMPONENT, RADIATION DETECTOR, AND RADIATION IMAGING SYSTEM

(71) Applicant: CANON KABUSHIKI KAISHA, Tokyo (JP)

(72) Inventor: Yu Katase, Kanagawa (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 179 days.

(21) Appl. No.: 18/751,653

(22) Filed: Jun. 24, 2024

(65) Prior Publication Data

US 2025/0022906 A1     Jan. 16, 2025

(30) Foreign Application Priority Data

Jul. 11, 2023     (JP) ................................. 2023-113995

(51) Int. Cl.
   *H10F 39/18*      (2025.01)
   *G01T 1/24*       (2006.01)
   *H10F 39/00*      (2025.01)
(52) U.S. Cl.
   CPC ......... *H10F 39/1892* (2025.01); *G01T 1/244* (2013.01); *H10F 39/804* (2025.01); *H10F 39/811* (2025.01)
(58) Field of Classification Search
   CPC .. H10F 39/1892; H10F 39/804; H10F 39/811; G01T 1/244
   See application file for complete search history.

(56) References Cited

U.S. PATENT DOCUMENTS

| | | | | |
|---|---|---|---|---|
| 3,614,677 A | * | 10/1971 | Wilfinger | ................. H03H 9/46 257/418 |
| 11,011,558 B2 | | 5/2021 | Sakaguchi et al. | |
| 2008/0057615 A1 | * | 3/2008 | Okagawa | .............. H10F 39/014 438/73 |
| 2008/0224246 A1 | * | 9/2008 | Lee | ................... H01L 21/76849 438/70 |
| 2009/0079020 A1 | * | 3/2009 | Tanida | .................. H10F 39/804 438/69 |
| 2010/0102454 A1 | * | 4/2010 | Akiyama | .......... H01L 21/76898 257/774 |

(Continued)

FOREIGN PATENT DOCUMENTS

JP          2019-87640 A      6/2019

*Primary Examiner* — Kiho Kim
(74) *Attorney, Agent, or Firm* — VENABLE LLP

(57)     ABSTRACT

An electronic component includes a first support member having a third main surface and a fourth main surface, at least a partial portion of the third main surface supporting at least a partial portion of the second main surface of the semiconductor substrate, and a second support member having a fifth main surface and a sixth main surface, at least a partial portion of the fifth main surface supporting at least a partial portion of the fourth main surface of the first support member. In a case where the electronic component is seen through from a direction perpendicular to the first main surface, the semiconductor substrate has a first region and a second region adjoining an outer side of the first region, the semiconductor substrate does not overlap any of the first support member and the second support member in the first region.

14 Claims, 12 Drawing Sheets

100

(56) References Cited

U.S. PATENT DOCUMENTS

| 2010/0327383 | A1 * | 12/2010 | Hayasaki | .............. H10F 39/804 |
| | | | | 257/E31.127 |
| 2017/0273183 | A1 * | 9/2017 | Kawasaki | ................ H03H 3/08 |
| 2019/0140002 | A1 | 5/2019 | Sakaguchi et al. | |

\* cited by examiner

FIG.4A
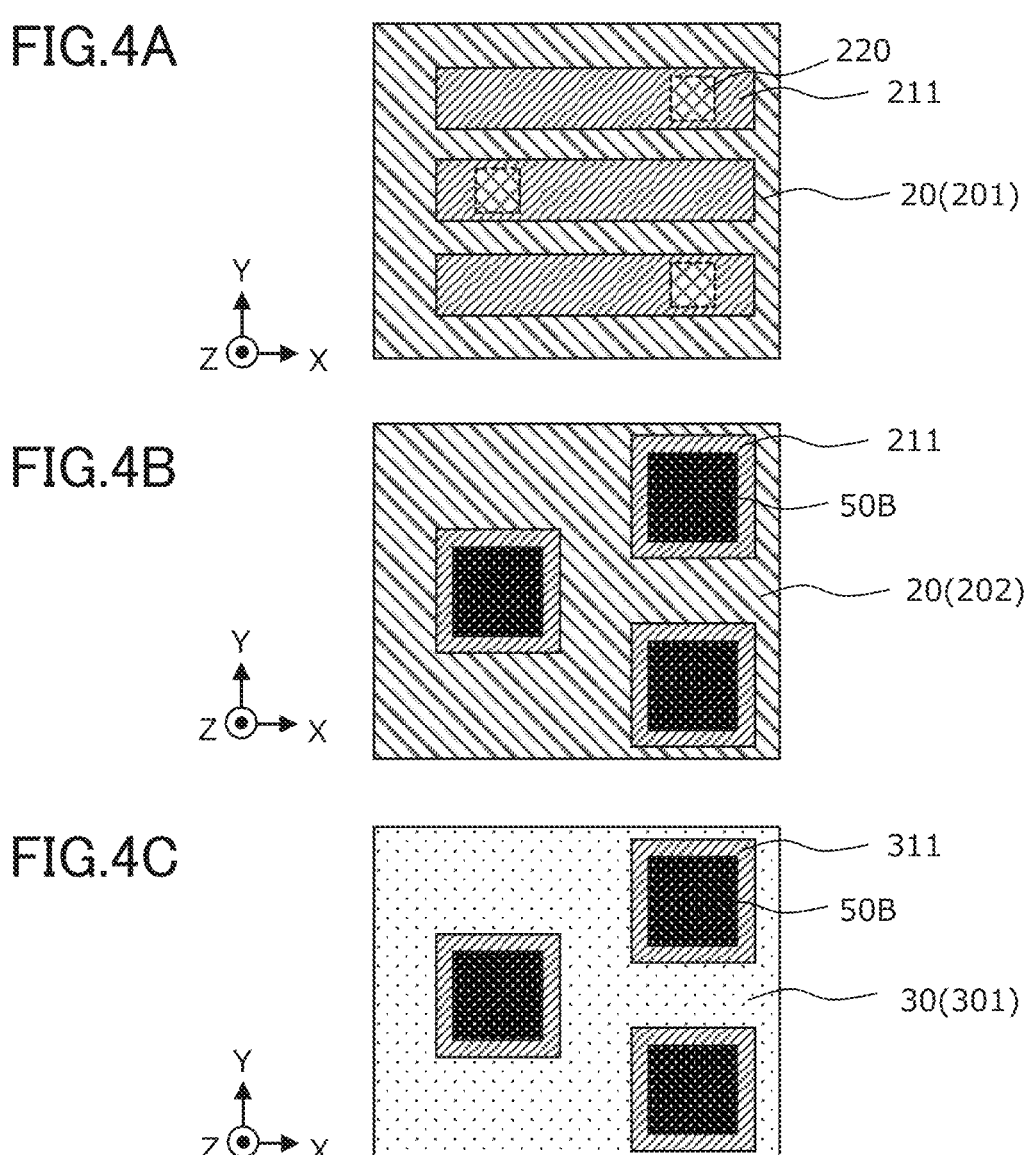
220
211
20(201)
FIG.4B
211
50B
20(202)
FIG.4C
311
50B
30(301)
FIG.4D
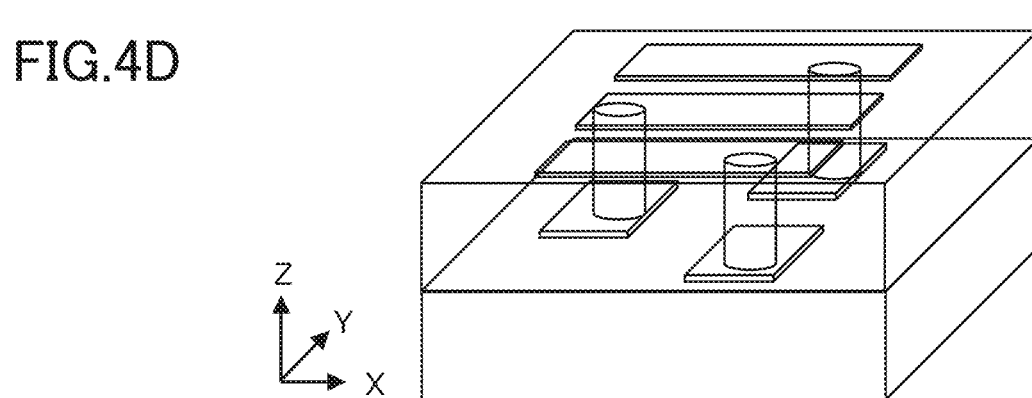

800

803      802

804

805
806

801

100, 100A, 100B, 100C

ELECTRONIC COMPONENT, RADIATION DETECTOR, AND RADIATION IMAGING SYSTEM

BACKGROUND

Field of the Disclosure

The present invention relates to an electronic component and a radiation detector.

Description of the Related Art

There has been known a radiation detector that obtains a radiation image by receiving a radiation with a semiconductor element such as a CMOS image sensor without using a scintillator (wavelength converter). In such a radiation detector, when the radiation penetrates deep into the semiconductor element, crosstalk occurs or secondary electrons are generated, which deteriorates detection accuracy. Thus, a semiconductor substrate is made thin. When the semiconductor substrate, which is a base of the semiconductor element, is made thin, the mechanical strength of the semiconductor substrate decreases.

JP 2019-87640 A discloses a detector in which a thickness of a semiconductor layer in at least a partial portion of a detection region is smaller than a thickness of a peripheral region. It is described that, in the detection region of the semiconductor layer, a plurality of grooves is provided on a back surface opposite to a surface on which an energy ray is incident to reduce crosstalk between pixels. In addition, it is described that strength is secured by holding a thin semiconductor layer with a thick peripheral region.

A method of electrically connecting a semiconductor element and a package serving as a container for mounting the semiconductor element with a wire and covering the wire with a sealing resin has been known. The semiconductor element, the package, and the sealing resin are different in linear expansion coefficient, because they are made of different materials. For this reason, a tension may be applied to a portion where the wire is bonded due to a change in temperature, and bonding reliability may deteriorate. However, JP 2019-87640 A does not specifically study the bonding reliability of the wire.

Therefore, concerning an electronic component including a semiconductor substrate having a small thickness and a support member for securing the strength of the semiconductor substrate, there has been a demand for a technology capable of achieving both the securement of the strength of the semiconductor substrate and the reliability of the electrical bonding of the semiconductor substrate to a package.

SUMMARY

According to a first aspect of the present invention, an electronic component includes a first support member having a third main surface and a fourth main surface, at least a partial portion of the third main surface supporting at least a partial portion of the second main surface of the semiconductor substrate, and a second support member having a fifth main surface and a sixth main surface, at least a partial portion of the fifth main surface supporting at least a partial portion of the fourth main surface of the first support member. In a case where the electronic component is seen through from a direction perpendicular to the first main surface, the semiconductor substrate has a first region and a second region adjoining an outer side of the first region, the semiconductor substrate does not overlap any of the first support member and the second support member in the first region, the semiconductor substrate overlaps both the first support member and the second support member in at least a partial portion of the second region, a first connection part configured to electrically connect the semiconductor substrate and the first support member to each other and a second connection part configured to electrically connect the first support member and the second support member to each other are provided outside the first region, and the first support member includes a through electrode configured to electrically connect the first connection part and the second connection part to each other.

Further features of the present invention will become apparent from the following description of exemplary embodiments with reference to the attached drawings.

BRIEF DESCRIPTION OF THE DRAWINGS

FIG. 4A is a plan view illustrating a portion of a third main surface 201 of a first support member 20 that is not covered with an adhesive layer 40A according to a modification.

FIG. 4B is a plan view illustrating a portion of a fourth main surface 202 of the first support member 20 opposite to the portion illustrated in FIG. 4A according to the modification.

FIG. 4C is a plan view illustrating a portion of a fifth main surface 301 of a second support member 30 facing the fourth main surface 202 illustrated in FIG. 4B.

FIG. 4D is a schematic perspective view when viewed from an oblique direction for explaining an internal structure of the first support member according to the modification.

DESCRIPTION OF THE EMBODIMENTS

Figure 1A:
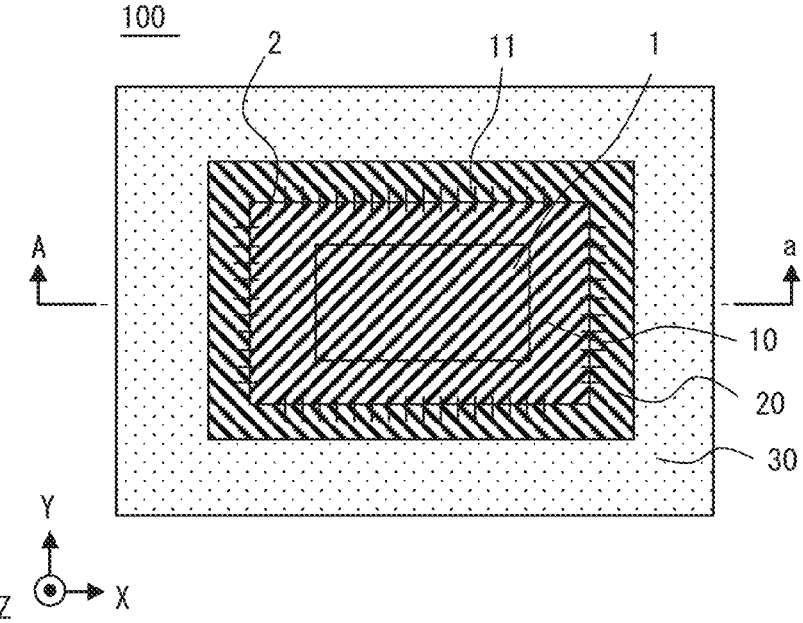
FIG. 1A is a schematic plan view of an example of an electronic component according to a first embodiment.

An electronic component and the like according to embodiments of the present invention will be described with reference to the drawings. Note that the embodiments to be described below are exemplary, and for example, detailed configurations can be appropriately modified for implementation by those skilled in the art without departing from the gist of the present invention.

It should be noted that, in the drawings referred to in the following description of the embodiment, elements denoted by the same reference numerals have the same functions unless otherwise specified. In the drawings, in a case where a plurality of identical elements is arranged, the reference numerals and explanations thereof may be omitted.

In addition, since the drawings may be schematically represented for convenience of illustration and description, shapes, sizes, arrangements, and the like of elements shown in the drawings may not exactly coincide with actual objects. In addition, "XX or more and YY or less" or "XX to YY" indicating a numerical range means a numerical range including end points XX (lower limit) and YY (upper limit) unless otherwise specified. When numerical ranges are described in stages, the upper limits and the lower limits of the respective numerical ranges can be combined in any manner.

In the following description, for example, an X-plus direction refers to a direction indicated by an X-axis arrow in the illustrated coordinate system, and an X-minus direction refers to a direction 180-degree opposite to the direction indicated by the X-axis arrow in the illustrated coordinate system. The same applies to directions other than X.

A radiation detector is exemplified as the electronic component according to an embodiment A radiation detected by the radiation detector may be an electromagnetic wave or a particle beam. The electromagnetic wave may be a light ray such as an infrared ray, a visible ray, or an ultraviolet ray, a radio wave such as a microwave, or an ionizing radiation such as an X-ray or a gamma ray. Examples of the particle beam include an alpha beam, a beta beam, an electron beam, a neutron beam, a proton beam, a heavy ion beam, and an intermediate beam. The structure of the radiation detector, for example, a thickness of a semiconductor layer that converts a radiation into an electrical signal, may be appropriately set according to the transmission characteristics and absorption characteristics of the radiation to be detected.

First Embodiment

Figure 1B:
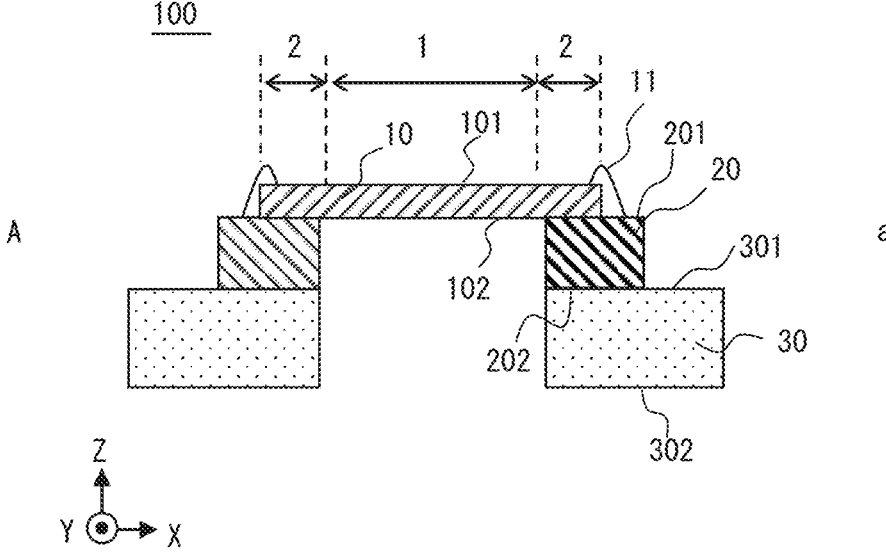
FIG. 1B is a schematic view illustrating a cross section of the electronic component taken along line A-a in FIG. 1A.
Figure 2:
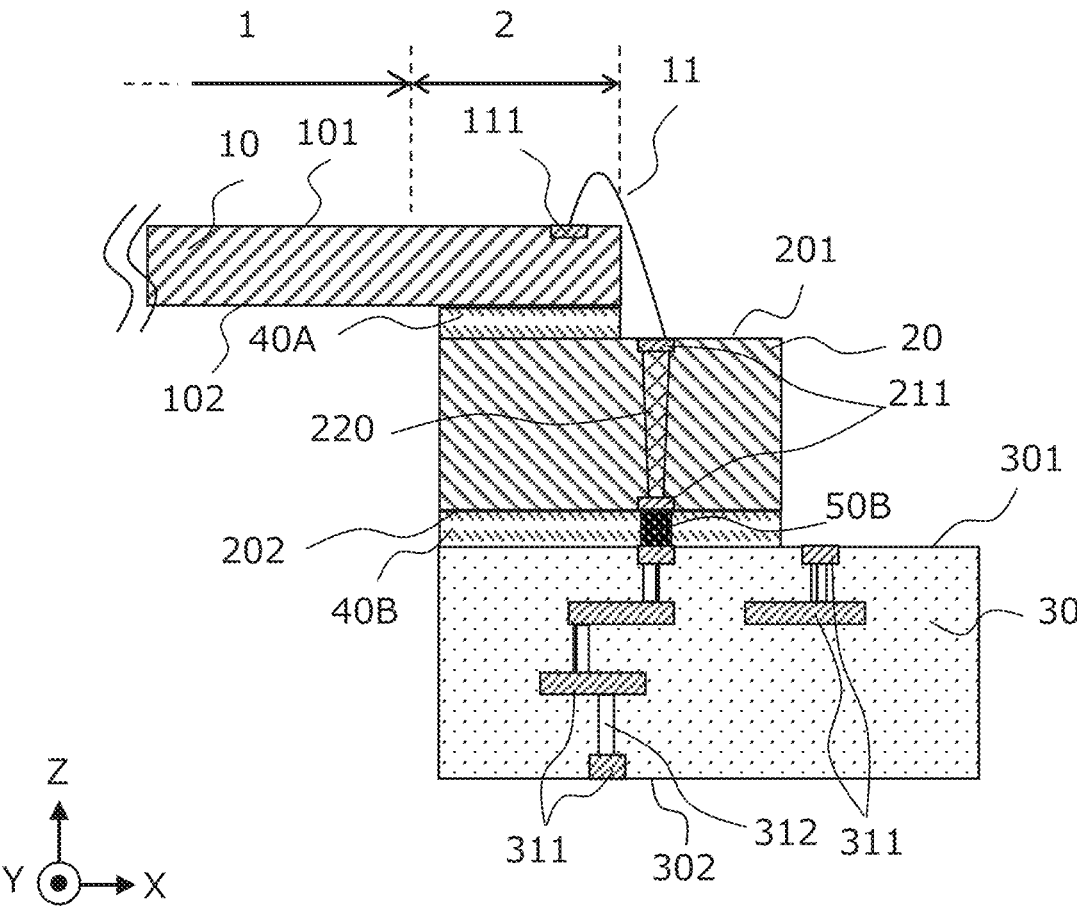
FIG. 2 is a partially enlarged cross-sectional view obtained by extracting and enlarging a right portion of FIG. 1B.

An example of an electronic component according to the first embodiment will be described. FIG. 1A is a schematic plan view of an electronic component 100 as an example according to the present embodiment, and FIG. 1B is a schematic view illustrating a cross section of the electronic component 100 taken along line A-a in FIG. 1A. FIG. 2 is a partially enlarged cross-sectional view illustrating a structure in more detail by extracting and enlarging a right portion of FIG. 1B. The electronic component 100 includes a semiconductor substrate 10, a first support member 20 that supports the semiconductor substrate 10, and a second support member 30 that supports the first support member 20.

The semiconductor substrate 10 has a first main surface 101 and a second main surface 102 opposite thereto. The semiconductor substrate 10 is disposed such that the first main surface 101 and the second main surface 102 are parallel to an XY plane defined by an X direction and a Y direction. Assuming that a direction perpendicular to the first main surface 101 and the second main surface 102 is a Z direction, a size of the semiconductor substrate 10 in the Z direction is typically smaller than a size in the X direction and a size in the Y direction of the semiconductor substrate 10. That is, the semiconductor substrate 10 has a substantially flat plate shape. In the following description, a dimension of a member in the Z direction may be expressed as "thickness".

The semiconductor substrate 10 includes a single crystal layer of silicon, germanium, or the like, or a polycrystalline layer, and has a first region and a second region. When the electronic component 100 is a radiation detector, the first region can be referred to as a detection region 1, and the second region can be referred to as a peripheral region 2. Typically, the detection region 1 is located at the center of the semiconductor substrate 10 in a plan view, and the peripheral region 2 is arranged adjacent to the periphery of the detection region in a plan view. The first main surface 101 of the semiconductor substrate 10 is a main surface on the radiation incident side.

The detection region 1 is a region in which a detection element (light receiving unit) is provided to convert an electron generated by an incident radiation into an output signal, and has a structure in which a plurality of pixels and reading circuits for forming an image based on the radiation are arranged on a matrix. Each of the plurality of pixels serving as the light receiving unit can include a photodiode, similarly to a CMOS image sensor and a CCD. As the photodiode, a compound semiconductor such as cadmium telluride (CdTe) or cadmium zinc telluride (CdZnTe) may be used. In addition, a photon counting principle may be used, and a device such as a single photon avalanche diode (SPAD) may be used.

In consideration of a balance between prevention of crosstalk and securement of mechanical strength, the thickness of the semiconductor substrate 10 in the detection region 1 is preferably 10 μm or more and 100 μm or less, and more preferably 25 μm or more and 75 μm or less. Typically, the thickness is set to 50 μm.

In the peripheral region 2, peripheral circuits such as a drive circuit, a control circuit, a signal processing circuit, and an output circuit, an input terminal, and an output terminal are provided. The drive circuit is a circuit that scans and drives the reading circuit of each pixel in the detection region 1. The control circuit is a circuit that controls drive timings of the drive circuit, the signal processing circuit, and the like, and may include a timing generator and the like. The signal processing circuit processes a signal read from the reading circuit in the detection region 1, and may include an amplifier circuit and an AD conversion circuit. The output circuit converts a signal obtained by the signal processing circuit into a predetermined format and outputs the converted signal, and may include a differential transmission circuit. The input terminal is a terminal to which a power supply or a control signal is input from the outside, and the output terminal is a terminal from which a signal is output to the outside. The thickness of the semiconductor substrate 10 in the peripheral region 2 may be equal to that in the detection region 1, but may be larger than that in the detection region 1.

In the semiconductor substrate 10, at least a partial portion of the peripheral region 2 of the second main surface 102, which is a main surface on a side opposite to the radiation incident side, faces the first support member 20. The first support member 20 has an opening portion at least immediately below the detection region 1. At least a partial portion of the peripheral region 2 in the semiconductor substrate 10 faces at least a partial portion of the second support member 30 with the first support member 20 interposed therebetween. The second support member 30 has an opening portion at least immediately below the detection region 1.

Although not illustrated in FIG. 1B for convenience of illustration, as can be seen with reference to FIG. 2, in a region where the second main surface 102 of the semiconductor substrate 10 and the first support member 20 face each other, the second main surface 102 and a third main surface 201 of the first support member 20 are bonded to each other by an adhesive layer 40A. In a region where the first support member 20 and the second support member 30 face each other, a fourth main surface 202 of the first support member 20 and a fifth main surface 301 of the second support member 30 are bonded to each other by an adhesive layer 40B.

An adhesive is used for the adhesive layer 40A and the adhesive layer 40B, but in some cases, a die attach film (DAF), a double-sided tape, or the like may be used for bonding. In the regions where the members face each other, the entire areas where the members face each other may not be bonded to each other by the adhesive layer 40A and the adhesive layer 40B, and at least partial portions of the areas where the members face each other may be bonded to each other.

The first support member 20 is disposed between the semiconductor substrate 10 and the second support member 30 to secure the mechanical strength of the semiconductor substrate 10 as a first function. Then, as a second function, the first support member 20 electrically connects the semiconductor substrate 10 and the second support member 30 to each other. That is, the first support member 20 functions as an interposer (relay board) interposed between the semiconductor substrate 10 and the second support member 30.

In general, the second support member 30 and the semiconductor substrate 10 are made of different materials. If the semiconductor substrate 10 and the second support member 30 are directly bonded to each other without interposing the first support member 20, thermal stress may be applied due to a difference in linear expansion coefficient, resulting in damage to the thin semiconductor substrate 10. In the present embodiment, if the first support member 20 interposed between the semiconductor substrate 10 and the second support member 30 is focused only on mechanical strength, the first support member 20 may be any of a semiconductor, an insulator, and a conductor as long as it has sufficient stiffness to support the semiconductor substrate 10. However, in order to achieve both the reduction of the stress caused due to the difference in linear expansion coefficient between the semiconductor substrate 10 and the first support member 20 and the electrical connection as an interposer, the first support member 20 is preferably made of the same type of semiconductor material as the semiconductor substrate 10. That is, in a case where the semiconductor substrate 10 is a silicon substrate, the first support member 20 is preferably made of silicon, and in a case where the semiconductor substrate 10 is a germanium substrate, the first support member 20 is preferably made of germanium.

The thickness of the first support member 20 is preferably 100 μm or more, and more preferably 300 μm or more to secure mechanical strength. Typically, the thickness of the first support member 20 is set to 700 μm or more and 800 μm or less, which is a standard thickness of a general 8-inch wafer or a general 12-inch wafer. By cutting out a wafer having a standard thickness, the first support member 20 can be easily manufactured.

As illustrated in FIG. 2, the semiconductor substrate 10 and the first support member 20 are electrically connected to each other via a wire 11 that connects a conductor layer 111 provided on the first main surface 101 of the semiconductor substrate 10 and a conductor layer 211 provided on the third main surface 201 of the first support member 20. The first support member 20 needs to be larger than the semiconductor substrate 10 in the X direction and the Y direction in a plan view in order to secure at least a region for connecting the wire 11. Note that the conductor layer 111 and the conductor layer 211 electrically connected to each other via the wire 11 can be collectively referred to as a first connection part.

The first support member 20 includes a through electrode 220 that connects the conductor layer 211 provided on the third main surface 201 and the conductor layer 211 provided on the fourth main surface 202 to each other. The first support member 20 can be electrically connected to the second support member 30 via the conductor layer 211 provided on the fourth main surface 202. Therefore, the first support member 20 can electrically relay the semiconductor substrate 10 and the second support member 30 to each other.

The second support member 30 is a substrate on which electric circuits for achieving various functions are mounted, and can also be said to be a package on which the semiconductor substrate 10 supported by the first support member 20 is mounted. The specific functions of the electric circuits include supplying a control signal and power to a radiation detection sensor provided in the semiconductor substrate 10, processing a signal output from the semiconductor substrate 10, storing a signal, transmitting a signal to an external computer or a network, and the like.

The second support member 30 has an opening at a position immediately below the detection region 1 of the semiconductor substrate 10. The second support member 30 can be formed by molding, cutting, stacking plate materials, or the like. The base material of the second support member 30 is preferably an insulator so that a signal line or a power supply line electrically connected to the first support member 20 can be provided. From the viewpoint of mechanical strength, a rigid substrate such as a glass epoxy substrate, a composite substrate, a glass composite substrate, a bakelite substrate, or a ceramic substrate is preferable, and in particular, it is preferable to use a ceramic substrate or a glass epoxy substrate. In a case where ceramic is used, it is preferable to use a ceramic laminate. As the ceramic material, silicon carbide, aluminum nitride, sapphire, alumina, silicon nitride, cermet, yttria, mullite, forsterite, cordierite, zirconia, steatite, or the like can be used.

The second support member 30 includes conductor layers 311 on the fifth main surface 301, on a sixth main surface 302 opposite to the fifth main surface, and inside the substrate. These conductor layers 311 may be connected to each other by a plurality of conductive members 312 (vias). In addition, the conductor layer 211 provided on the fourth main surface 202 of the first support member 20 and the conductor layer 311 provided on the fifth main surface of the second support member 30 are electrically connected to each other via a conductive member 50B. The conductor layer 211 and the conductor layer 311 electrically connected to each other by the conductive member 50B can be collectively referred to as a second connection part.

In this manner, the semiconductor substrate 10 and the first support member 20 are electrically connected to each other by the wire 11, and the first support member 20 and the second support member 30 are electrically connected to each other by the conductive member 50B. That is, the semiconductor substrate 10 and the second support member 30 are electrically connected to each other by the wire 11, the first support member 20, and the conductive member 50B.

Figure 3A:
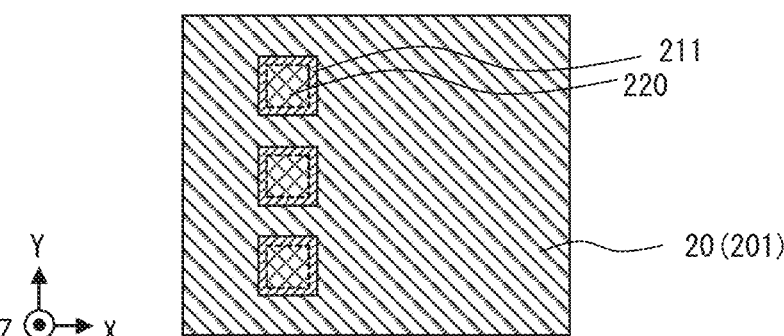
FIG. 3A is a plan view illustrating a portion of a third main surface 201 of a first support member 20 that is not covered with an adhesive layer 40A.
Figure 3B:
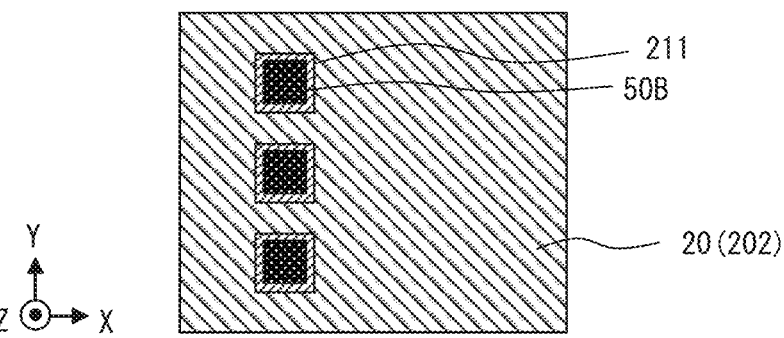
FIG. 3B is a plan view illustrating a portion of a fourth main surface 202 of the first support member 20 opposite to the portion illustrated in FIG. 3A.
Figure 3C:
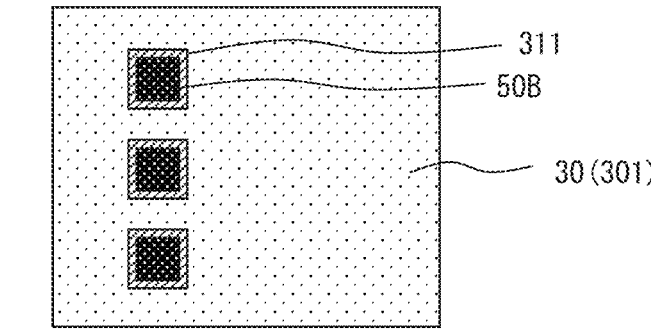
FIG. 3C is a plan view illustrating a portion of a fifth main surface 301 of a second support member 30 facing the fourth main surface 202 illustrated in FIG. 3B.

With reference to FIGS. 3A to 3C, structures of portions for electrical connection will be exemplified. FIG. 3A is a plan view illustrating a portion of the third main surface 201 of the first support member 20 that is not covered with the adhesive layer 40A. As illustrated, the conductor layer 211 (and the through electrode 220 in some cases) is exposed, and the wire 11 is connected to this portion as illustrated in FIG. 2.

FIG. 3B is a plan view (rear view) illustrating a portion of the fourth main surface 202 of the first support member 20 opposite to the portion illustrated in FIG. 3A. As illustrated, the conductor layer 211 (and the through electrode 220 in some cases) is exposed, and the conductive member 50B is connected to this portion.

FIG. 3C is a plan view illustrating a portion of the fifth main surface 301 of the second support member 30 facing the fourth main surface 202 illustrated in FIG. 3B. As illustrated, the conductor layer 311 is exposed, and the conductive member 50B is connected to this portion.

In the example illustrated in FIGS. 3A to 3C, there are three locations for electrical connection, in a plan view, on each of the third main surface 201 and the fourth main surface 202 of the first support member 20 and the fifth main surface 301 of the second support member 30, and the locations on the third, fourth, and fifth main surfaces are aligned along the Z direction. However, the structures of the portions for electrical connection are not limited to this example, and may be implemented, for example, according to a modification illustrated in FIGS. 4A to 4D, or may be other structures.

FIG. 4D is a schematic perspective view when viewed from an oblique direction to explaining an internal structure of the first support member 20, which is a relay board. FIG. 4A is a plan view illustrating a portion of the third main surface 201 of the first support member 20 that is not covered with the adhesive layer 40A, and FIG. 4B is a plan view (rear view) illustrating a portion of the fourth main surface 202 of the first support member 20 opposite to the portion illustrated in FIG. 4A. FIG. 4C is a plan view illustrating a portion of the fifth main surface 301 of the second support member 30 facing the fourth main surface 202 illustrated in FIG. 4B. In this example, the conductor layer 211 of the third main surface 201 connected to the wire 11 has a rectangular shape in a plan view, facilitating wire bonding. Further, concerning the conductor layer 211 and the conductor layer 311 for electrical connection between the first support member 20 and the second support member 30, their pattern shapes are enlarged in a plan view as compared with those in the preceding example, and they are dispersedly arranged on the fourth main surface 202 and the fifth main surface 301. In the preceding example, as shown in FIGS. 3B and 3C, the conductor layers 211 and the conductor layers 311 are arranged along the Y direction in a plan view, and thus their pattern shapes cannot be enlarged. In contrast, in the example illustrated in FIGS. 4B and 4C, since the pattern shapes can be enlarged by dispersedly arranging the patterns in the XY plane and increasing the intervals therebetween, the reliability and certainty of the electrical connection can be improved.

Returning to FIG. 2, the electronic component 100 can be electrically connected to an external circuit (not shown) via the second support member 30. That is, the electronic component 100 can be electrically connected to the external circuit, using a conductor layer 311 that is not connected to the first support member 20 among the conductor layer 311 disposed on the sixth main surface 302 and the conductor layer 311 disposed on the fifth main surface 301. The electrical connection to the external circuit by a signal line, a power supply line, or the like may be made only on the fifth main surface 301 side, only on the sixth main surface 302 side, or on both sides.

Comparison with Reference Mode

Figure 5A:
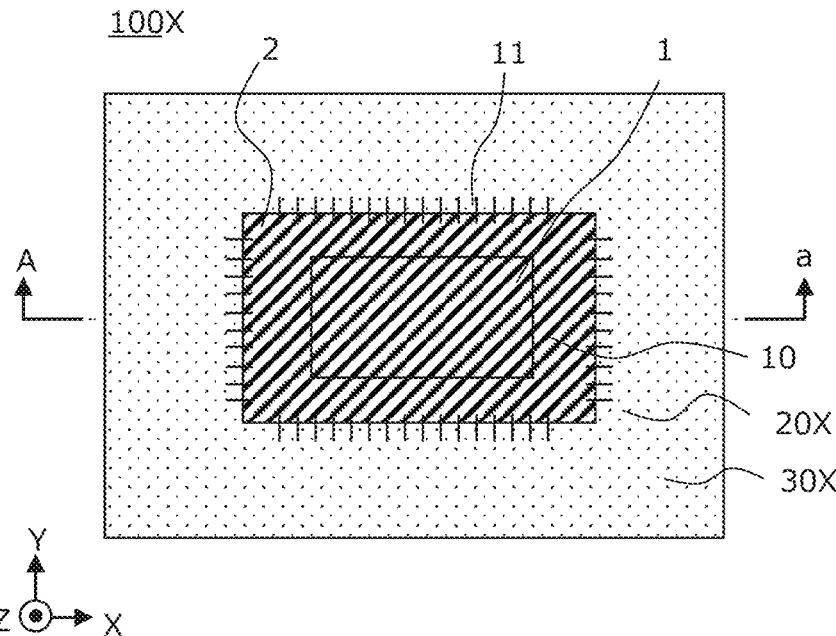
FIG. 5A is a schematic plan view of an electronic component 100X as a reference mode.
Figure 5B:
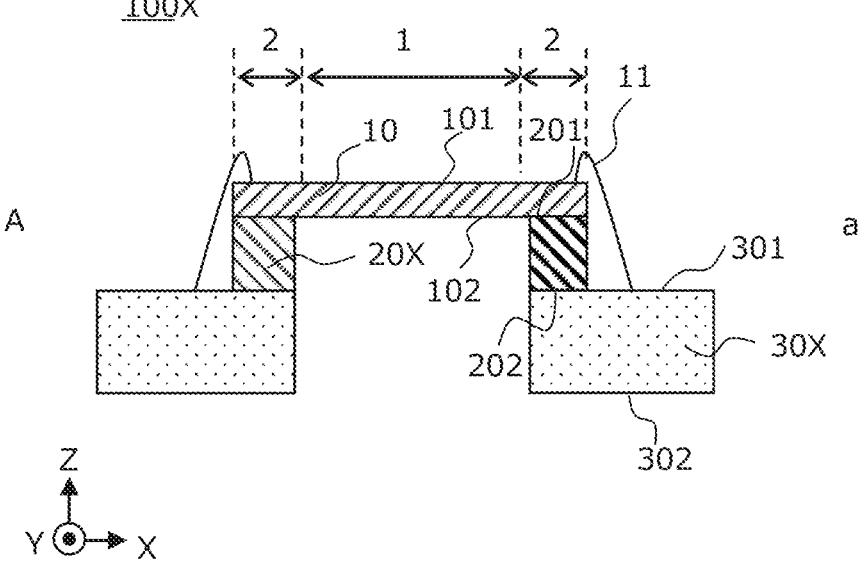
FIG. 5B is a schematic view illustrating a cross section of the electronic component 100X taken along line A-a in FIG. 5A.

For comparison with the above-described embodiment, a reference mode will be described with reference to the drawings. FIG. 5A is a schematic plan view of an electronic component 100X as a reference mode, and FIG. 5B is a schematic view illustrating a cross section of the electronic component 100X taken along line A-a in FIG. 5A. Description of matters common to the embodiment will be simplified or omitted.

The reference mode is common to the embodiment in that a first support member 20X mechanically supports the semiconductor substrate 10, but the first support member 20X does not have an electrically relaying function. That is, the first support member 20X functions only as a spacer having mechanical strength, not as an interposer including conductor layers 211 and a through electrode 220 as in the embodiment.

In the reference mode, the semiconductor substrate 10 and a second support member 30X are electrically connected to each other in a direct manner by the wire 11. In general, it is not possible to perform wire bonding in a state where the axis of the wire is erected at a right angle with respect to the bonding surface, and it is necessary to perform wire bonding with the wire being attached to the bonding surface at a certain angle or more with respect to the bonding surface. In the reference mode, in order to connect the semiconductor substrate 10 and the second support member 30 to each other by the wire 11, it is necessary to increase the length of the wire 11 as much as the thickness of the first support member 20X, and furthermore, it is necessary to arrange the connection position on the second support member 30X on a side farther away in the X-plus direction from the outer periphery of the substrate than that in the embodiment. In general, since the semiconductor substrate 10 and the second support member 30X are made of different materials, as the positions at which the wire is connected are farther away from each other in a plan view, the influence of the stress caused due to the difference in the linear expansion coefficient increases, deteriorating the bonding reliability of the wire 11.

If the detection region 1 having a sufficient size is secured and the peripheral region 2 having a circuit scale corresponding thereto is provided, the semiconductor substrate 10 can have a size of several tens of mm or more on one side in plan. When the size (the size in the XY direction) of the main surface of the semiconductor substrate 10 in a plan view increases in this manner, the influence of the stress caused due to the difference in linear expansion coefficient between the semiconductor substrate 10 and the second support member 30X increases, making it difficult to secure the bonding reliability of the wire 11.

In contrast, in the present embodiment, the semiconductor substrate 10 is electrically connected by the wire 11 to the first support member 20 located closer to the semiconductor substrate 10 in the Z direction than the second support member 30. Accordingly, the point at which the wire 11 is connected in the first support member 20 can be located closer to the center of the substrate in a plan view as compared with that in the reference mode, decreasing the influence of the stress caused due to the difference in linear expansion coefficient. Furthermore, according to the present embodiment, the base material of the first support member 20 to which the wire is connected can be the same material as the semiconductor substrate 10. By doing so, it is possible to significantly reduce the stress generated due to the difference in linear expansion coefficient. In other words, by using the same material as the main component of the semiconductor substrate 10 and the main component of the first support member 20, the linear expansion coefficients of the semiconductor substrate 10 and the first support member 20 can be substantially equal. Note that the main component is a component having the largest weight among a plurality of components (materials) constituting the substrate, and can be, for example, silicon. Furthermore, in the present embodiment, the wiring length of the wire 11 can be reduced as much as the length of the first support member 20X as compared with that in the reference mode, thereby reducing the wiring resistance.

As described above, according to the present embodiment, in an electronic component including a semiconductor substrate having a small thickness and a support member for securing the strength of the semiconductor substrate, both the securement of the strength of the semiconductor substrate and the reliability of the electrical bonding of the semiconductor substrate to a package can be achieved.

Second Embodiment

Figure 6A:
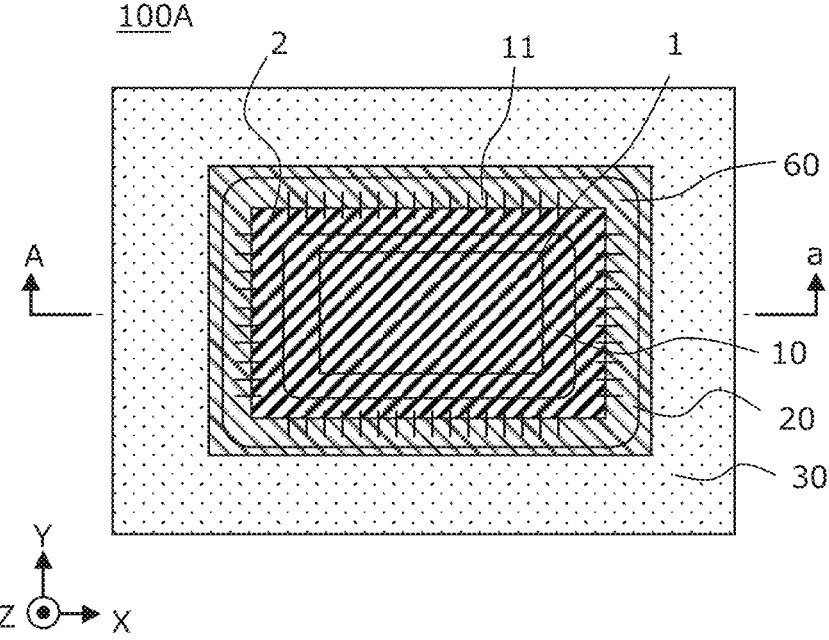
FIG. 6A is a schematic plan view of an electronic component as an example according to a second embodiment.
Figure 6B:
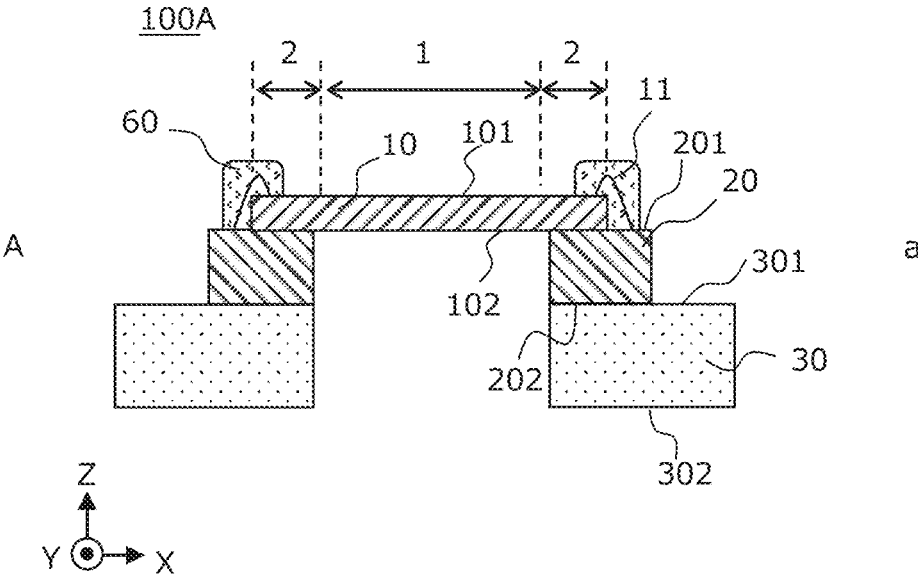
FIG. 6B is a schematic view illustrating a cross section taken along line A-a in FIG. 6A.
Figure 7:
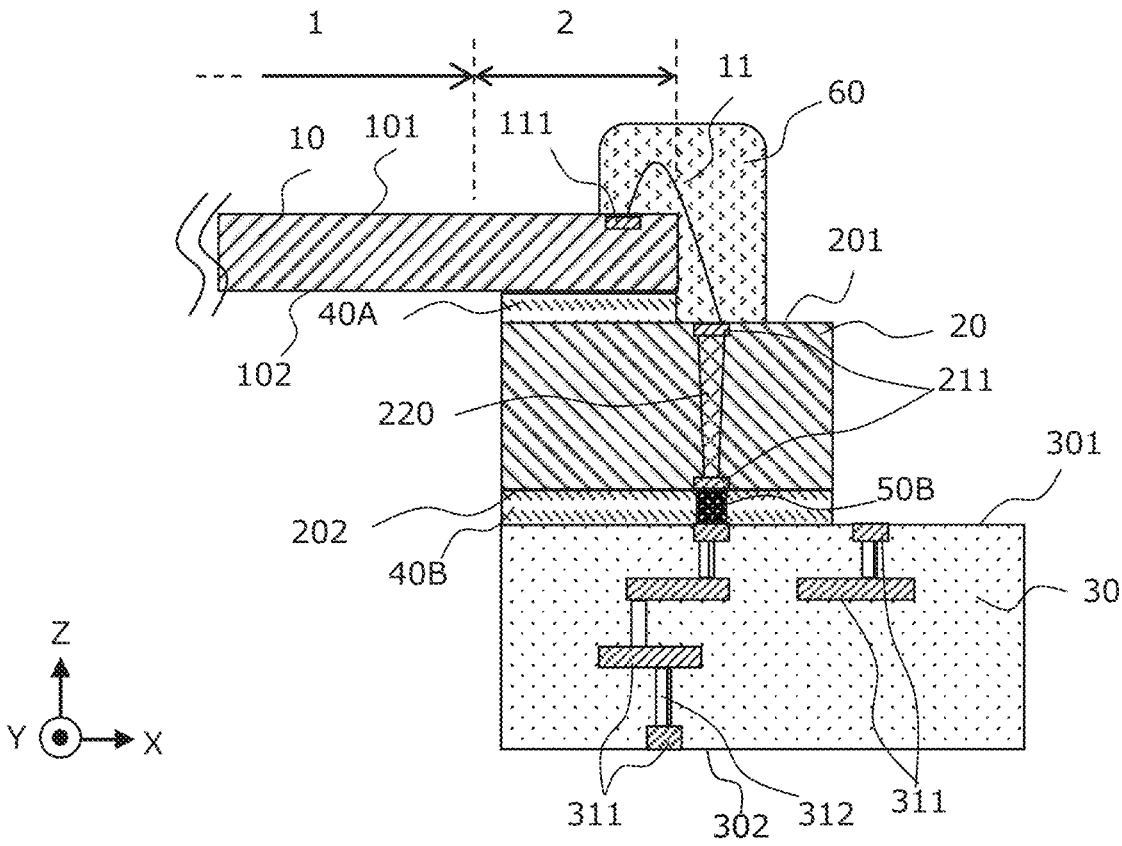
FIG. 7 is a partially enlarged cross-sectional view obtained by extracting and enlarging a right portion of FIG. 6B.

An example of an electronic component according to a second embodiment will be described. FIG. 6A is a schematic plan view of an electronic component 100A as an example according to the present embodiment, and FIG. 6B is a schematic view illustrating a cross section of the electronic component 100A taken along line A-a in FIG. 6A. FIG. 7 is a partially enlarged cross-sectional view illustrating a structure in more detail by extracting and enlarging a right portion of FIG. 6B. Description of matters common to the first embodiment will be simplified or omitted.

The electronic component 100A according to the present embodiment is different from that according to the first embodiment in that the wire 11 electrically connecting the semiconductor substrate 10 and the first support member 20 to each other is covered and protected by a resin 60. After bonding the wire 11, the resin 60 is formed to cover and seal the wire 11 as illustrated in FIG. 7. When the wire 11 is exposed, there is a possibility that an external object may come into contact with the wire 11 while the electronic component is being handled in various manner, such as when the electronic component is attached to another component, equipment, or the like, or when the electronic component is conveyed, causing a defect such as short circuit between the wires 11, separation at a bonding portion, or disconnection. Therefore, in the present embodiment, the resin 60 is provided to protect the wire 11 from the external environment.

Examples of the material of the resin 60 include an epoxy resin, an acrylic resin, a silicone resin, and a vinyl resin. An appropriate type of resin may be selected in consideration of the filling property or fluidity of the resin, the twist of the wire, the elastic modulus of the wire after being cured, etc. In order to suppress the inflow of the resin 60 into the detection region 1 of the semiconductor substrate 10, a dam material (not illustrated) may be provided.

The resin 60 may extend to a position away outward from the outer peripheral end surface of the first support member 20 or to the second support member 30, but in order to prevent adhesion to an unnecessary place, it is preferable that the resin is located inside the outer peripheral end surface of the first support member 20 as long as the resin can cover the wire 11.

As a method of protecting the wire 11 from the external environment, there may be a method other than covering the wire 11 with the resin. For example, a lid member can be installed above the wire 11. For example, the second support member 30 is formed to have a recessed portion at the central thereof, and the semiconductor substrate 10 is supported by the first support member 20 is mounted in the recessed portion of the second support member 30. By appropriately setting the depth of the recessed portion, the height of the peripheral portion of the second support member 30 can be higher than the highest point of the wire. By bonding an appropriate lid member to the upper surface of the peripheral portion of the second support member 30, it is possible to provide an eave-like structure for protecting the wire from the external environment. However, since the wire is not sealed, the wire is not sufficiently protected from heat and humidity, and taking into account that the lid member increases the number of components and increases the external size of the electronic component, the wire is sealed using a resin as a preferable aspect of the second embodiment.

As compared with the reference mode illustrated in FIGS. 5A and 5B, in the second embodiment as well, the semiconductor substrate 10 is electrically connected by the wire 11 to the first support member 20 closer to the semiconductor substrate 10 in the Z direction than the second support member 30. Accordingly, the point at which the wire 11 is connected in the first support member 20 can be located closer to the center of the substrate in a plan view as compared with that in the reference mode, decreasing the influence of the stress caused due to the difference in linear expansion coefficient. Furthermore, according to the present embodiment, the base material of the first support member 20 to which the wire is connected can be the same material as the semiconductor substrate 10. Then, it is possible to suppress the stress generated due to the difference in linear expansion coefficient. In other words, by using the same material as the main component of the semiconductor substrate 10 and the main component of the first support member 20, the effective linear expansion coefficients of the semiconductor substrate 10 and the first support member 20 can be equal. Note that the main component is a component having the largest weight among a plurality of components (materials) constituting the substrate, and is, for example, silicon. Furthermore, the wiring length of the wire 11 can be reduced as much as the length of the first support member 20X in the present embodiment as compared with that in the reference mode, thereby reducing the wiring resistance. Furthermore, in the present embodiment, since the wire is protected from the external environment, reliability is improved when the electronic component is handled.

As described above, according to the present embodiment, in an electronic component including a semiconductor substrate having a small thickness and a support member for securing the strength of the semiconductor substrate, both the securement of the strength of the semiconductor substrate and the reliability of the electrical bonding of the semiconductor substrate to a package can be achieved.

Third Embodiment

Figure 8A:
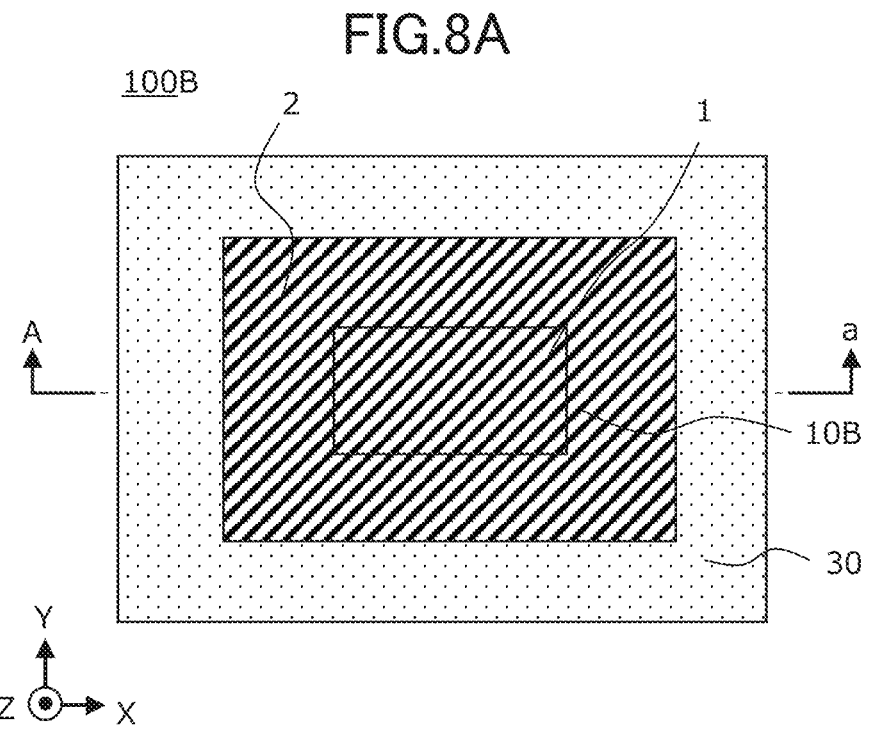
FIG. 8A is a schematic plan view of an electronic component as an example according to a third embodiment.
Figure 8B:
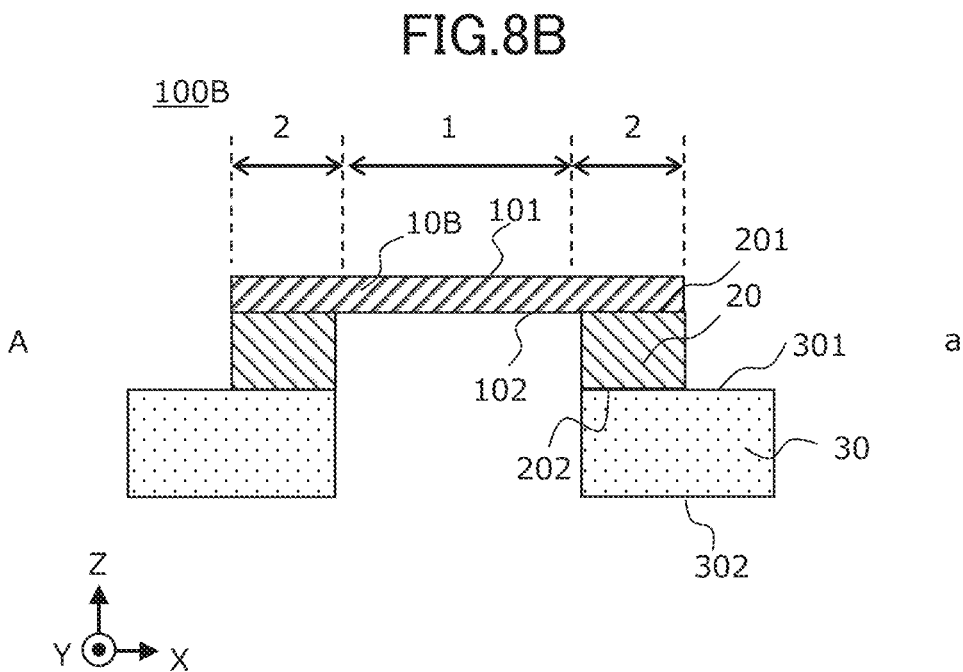
FIG. 8B is a schematic view illustrating a cross section taken along line A-a in FIG. 8A.
Figure 9:
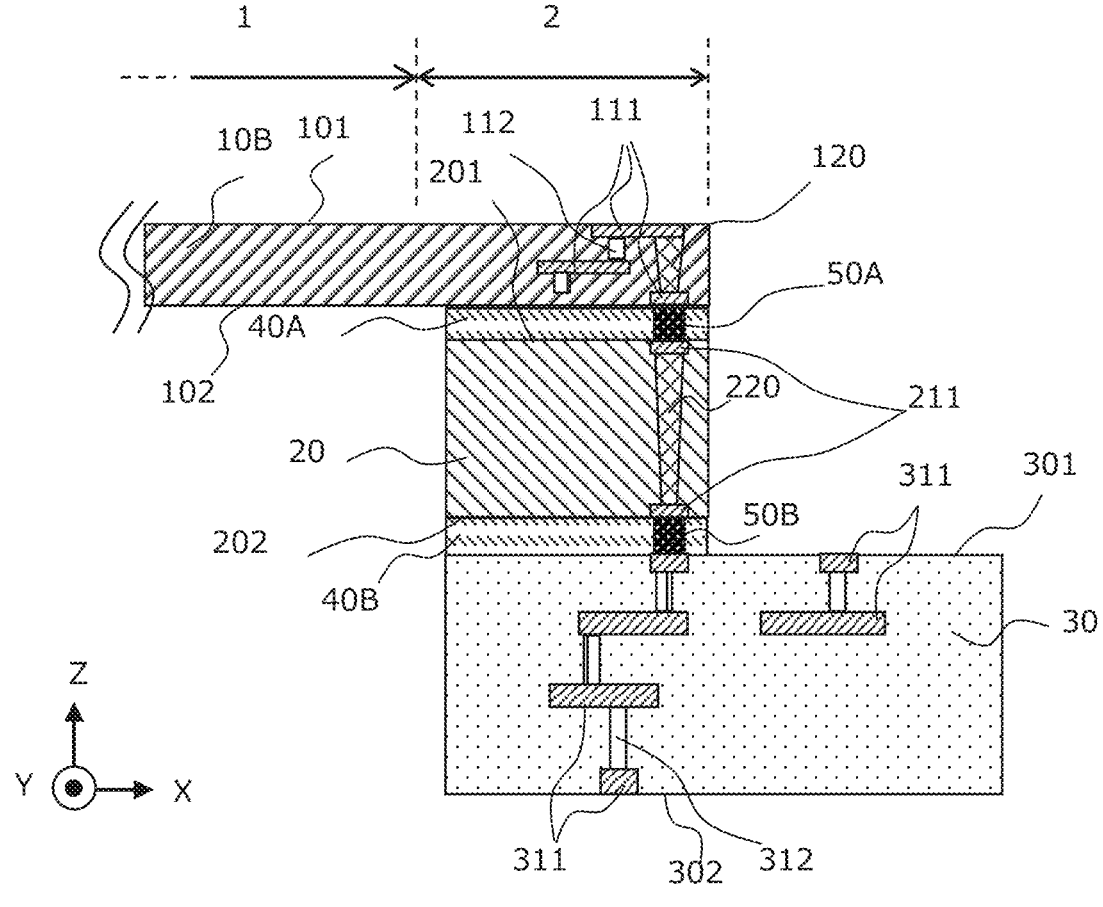
FIG. 9 is a partially enlarged cross-sectional view obtained by extracting and enlarging a right portion of FIG. 8B.

An example of an electronic component according to a third embodiment will be described. FIG. 8A is a schematic plan view of an electronic component 100B as an example according to the present embodiment, and FIG. 8B is a schematic view illustrating a cross section of the electronic component 100B taken along line A-a in FIG. 8A. FIG. 9 is a partially enlarged cross-sectional view illustrating a structure in more detail by extracting and enlarging a right portion of FIG. 8B. Description of matters common to the first embodiment will be simplified or omitted.

As illustrated in FIG. 9, unlike the electronic components according to the first embodiment and the second embodiment, in an electronic component 100B according to the present embodiment, a semiconductor substrate 10B and a first support member 20 are electrically connected to each other without using a wire.

In the semiconductor substrate 10B, a conductor layer 111 existing inside the semiconductor substrate 10B is connected to a transistor (not illustrated) via a conductive member 112 (via), and is further connected to a conductor layer 111 provided on the first main surface 101 via the conductive member 112 (via). Further, the semiconductor substrate 10B has a through electrode 120 that connects the conductor layer 111 provided on the first main surface 101 and a conductor layer 111 provided on the second main surface 102. A conductor layer 211 provided on the third main surface 201 of the first support member 20 is provided at a position facing the conductor layer 111 provided on the second main surface 102, and the conductor layer 211 and the conductor layer 111 are electrically connected to each other via a conductive member 50A.

In the example of FIG. 9, the conductor layer 111 inside the substrate is only one layer, but the layer configuration is not limited thereto, and it goes without saying that more conductive layers may be formed. Similarly to the first embodiment, the second main surface 102 of the semiconductor substrate 10B and the third main surface 201 of the first support member 20 are bonded to each other by the adhesive layer 40A as well as the conductive member 50A.

In the present embodiment, since the semiconductor substrate and the first support member are electrically connected to each other without using a wire, there is no concern that an external object may interfere with a wire protruding from the semiconductor substrate, which deteriorates the reliability of the electrical connection. In addition, since the wiring length can be reduced as compared with that in the case where the wire is used for connection, the wiring resistance can be reduced. In addition, since it is not necessary to provide a wire connection region in the first support member 20, the outer size of the first support member 20 can be equal to or smaller than the outer size of the semiconductor substrate 10, and the size of the electronic component in a plan view can be reduced.

Figure 10:
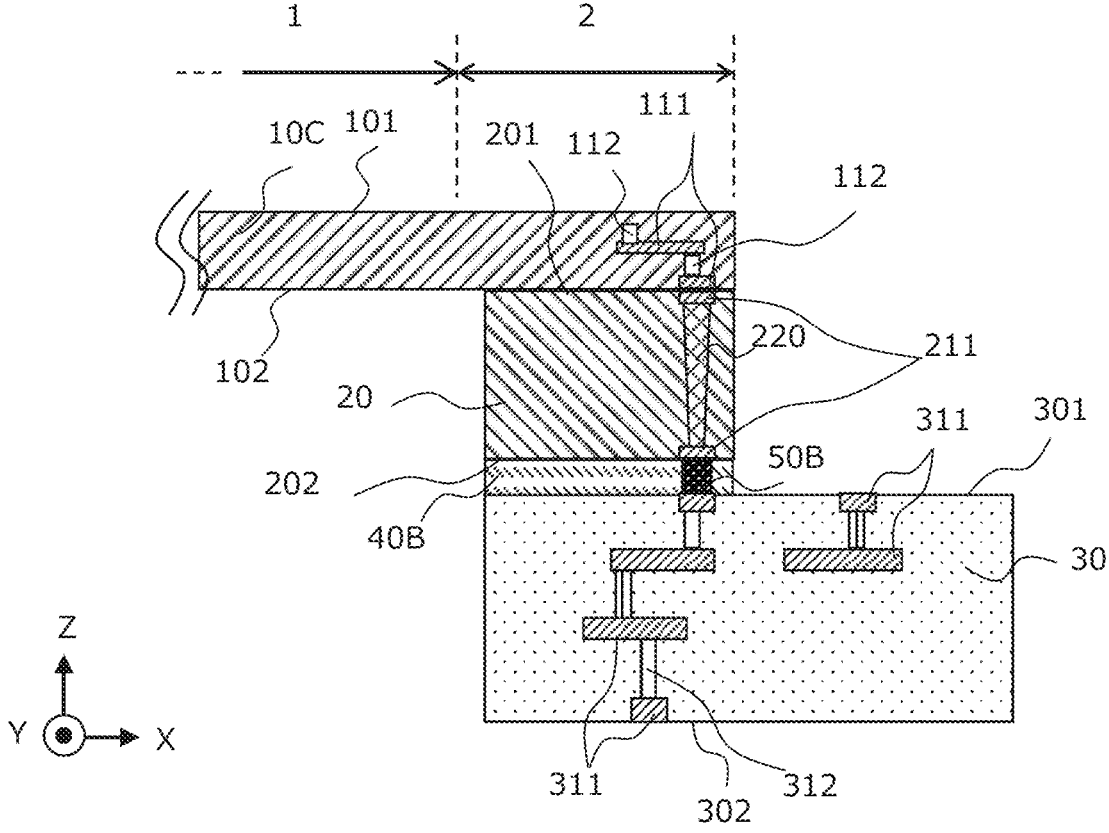
FIG. 10 is a partially enlarged cross-sectional view obtained by extracting and enlarging a right portion according to a modification of the third embodiment.

Note that the configuration of the semiconductor substrate and the method of bonding the semiconductor substrate and the first support member to each other according to the present embodiment are not limited to the example of FIG. 9, and may be implemented, for example, according to a modification in which a partially enlarged cross-sectional view is illustrated in FIG. 10. In a semiconductor substrate 10C, a conductor layer 111 existing in the semiconductor substrate 10C is connected to a transistor (not illustrated) via a conductive member 112 (via). The conductor layer 111 is connected to a conductor layer 111 provided on the second main surface 102 via another conductive member 112 (via). Note that, in an electronic component 100C illustrated in FIG. 10, the conductor layer 111 disposed inside the substrate is only one layer, but the layer configuration is not limited thereto, and it goes without saying that more conductive layers may be formed.

A conductor layer 211 provided on the third main surface 201 of the first support member 20 is provided at a position facing the conductor layer 111 provided on the second main surface 102, and the conductor layer 211 and the conductor layer 111 are directly bonded to each other to form a bonding portion. The conductor layer 111 and the conductor layer 211 can be formed of, for example, Cu, and can be bonded to each other by hybrid bonding of Cu therebetween. It is preferable that a large number of bonding places or a large area of a bonding place between the conductor layer 111 and the conductor layer 211 are provided in the surfaces of the second main surface 102 and the third main surface 201. This is because the mechanical bonding reliability and the electrical bonding reliability can be improved as the number of bonding places increases or the connection area increases.

In the configuration illustrated in FIG. 10, the wiring length can be reduced as compared with the configuration in which wiring is formed on the second main surface 102 after passing through the first main surface 101 as illustrated in FIG. 9, thereby suppressing wiring resistance. In addition, the portion connected by the hybrid bonding can be a heat dissipation path for efficiently discharging heat generated when the semiconductor substrate 10C is driven.

As compared with the electrical connection point from the semiconductor substrate to the second support member in the reference mode illustrated in FIGS. 5A and 5B, in the third embodiment, the electrical connection point from the semiconductor substrate to the first support member can be located at a position close to the center of the semiconductor substrate in a plan view. As a result, the range in which the thermal stress is developed due to the difference in linear expansion coefficient can be reduced, so that the influence of the thermal stress can be reduced. Furthermore, according to the present embodiment, the base material of the first support member 20 can be the same material as the semiconductor substrate 10B or the semiconductor substrate 10C. Then, it is possible to further suppress the stress generated due to the difference in linear expansion coefficient. In other words, by using the same material as the main component of the semiconductor substrate 10B or the semiconductor substrate 10C and the main component of the first support member 20, the effective linear expansion coefficients of the semiconductor substrate and the first support member 20 can be equal. Note that the main component is a component having the largest weight among a plurality of components (materials) constituting the substrate, and can be, for example, silicon. Furthermore, the wiring length can be reduced in the present embodiment as compared with that in a case where a long wire is used for connection as in the reference mode, thereby reducing the wiring resistance. In addition, in the present embodiment, since no wire exists, there is no concern that an external object may interfere with a wire, which improves reliability when the electronic component is handled.

As described above, according to the present embodiment, in an electronic component including a semiconductor substrate having a small thickness and a support member for securing the strength of the semiconductor substrate, both the securement of the strength of the semiconductor substrate and the reliability of the electrical bonding of the semiconductor substrate to a package can be achieved.

Fourth Embodiment

Figure 11:
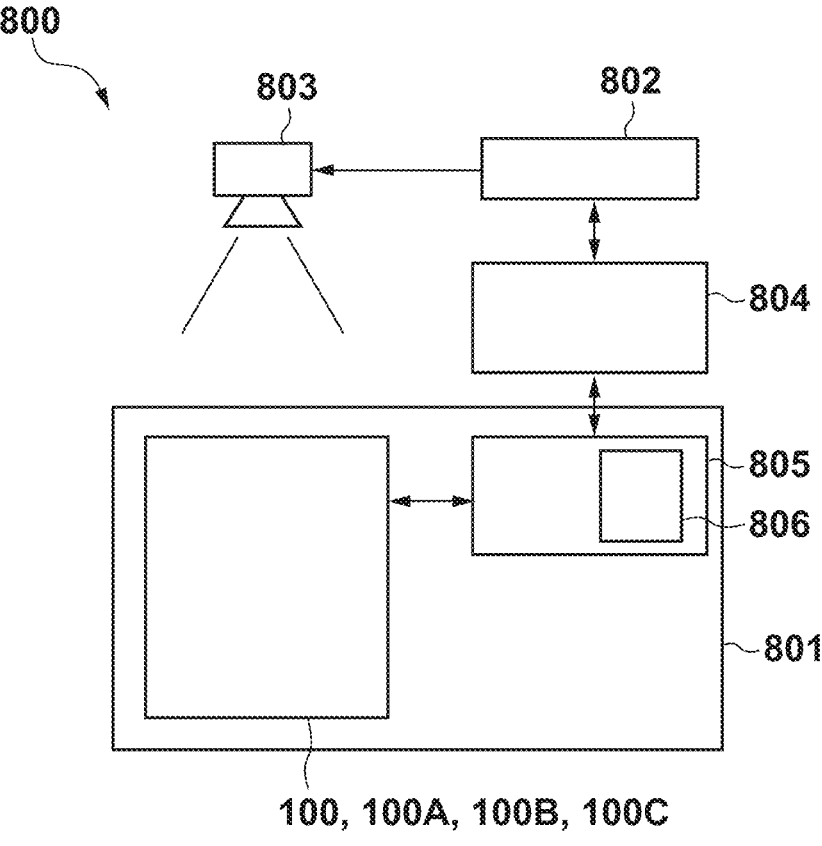
FIG. 11 is a diagram for explaining a radiation imaging apparatus according to a fourth embodiment and a radiation imaging system using the radiation imaging apparatus.

A radiation imaging apparatus 801 in which the radiation detector (electronic component) according to any one of the first to third embodiments described above is incorporated, and a radiation imaging system 800 using the radiation imaging apparatus will be described with reference to FIG. 11.

The radiation imaging system 800 is configured to electrically capture an optical image formed by a radiation to obtain an electrical radiation image (that is, radiation image data). The radiation imaging system 800 includes, for example, a radiation imaging apparatus 801, an exposure control unit 802, a radiation source 803, and a computer 804. The radiation imaging system 800 can display a captured radiation image on a display device (not illustrated) or transmit radiation image data to the outside via a communication device (not illustrated). The radiation imaging system 800 can be suitably used in, for example, a medical image diagnosis field, a non-destructive inspection field, or the like.

The radiation source 803 for emitting a radiation starts emitting a radiation in accordance with an exposure command from the exposure control unit 802. The radiation emitted from the radiation source 803 is emitted to the radiation imaging apparatus 801 through a subject (not illustrated). The radiation source 803 stops emitting the radiation in accordance with a stop command from the exposure control unit 802.

The radiation imaging apparatus 801 includes the radiation detector according to any one of the first to third embodiments described above, that is, any one of the electronic components 100 to 100C, and a control unit 805 for controlling the radiation detector. Furthermore, the radiation imaging apparatus 801 includes a signal processing unit 806 for processing a signal output from the radiation detector.

For example, in a case where the signal output from the radiation detector is an analog signal, the signal processing unit 806 can perform an A/D conversion on the analog signal and output the converted signal to the computer 804 as radiation image data. Furthermore, the signal processing unit 806 may generate a stop signal for stopping emitting the radiation from the radiation source 803, for example, based on a signal output from the radiation detector. The stop signal is supplied to the exposure control unit 802 via the computer 804, and the exposure control unit 802 sends a stop command to the radiation source 803 in response to the stop signal.

The control unit 805 can be constituted by, for example, a programmable logic device (PLD) such as a field programmable gate array (FPGA), an application specific integrated circuit (ASIC), a general-purpose computer in which a program is incorporated, or a combination of all or some thereof.

Furthermore, although the signal processing unit 806 is illustrated as being disposed in the control unit 805 or being a part of the function of the control unit 805, the signal processing unit 806 is not limited thereto. The control unit 805 and the signal processing unit 806 may be configured separately. Furthermore, the signal processing unit 806 may be disposed separately from the radiation imaging apparatus 801. For example, the computer 804 may have the function of the signal processing unit 806. Therefore, the signal processing unit 806 can be included in the radiation imaging system 800 as a signal processing device that processes a signal output from the radiation imaging apparatus 801.

The computer 804 can control the radiation imaging apparatus 801 and the exposure control unit 802, and perform processing for receiving radiation image data from the radiation imaging apparatus 801 and displaying the radiation image data as a radiation image. In addition, the computer 804 can function as an input unit for a user to input conditions for capturing a radiation image.

As an example of a sequence, the exposure control unit 802 including an exposure switch sends an exposure command to the radiation source 803 and sends a start notification indicating the start of radiation emission to the computer 804, when the exposure switch is turned on by the user. The computer 804 that has received the start notification notifies the control unit 805 of the radiation imaging apparatus 801 of the start of radiation emission in response to the start notification. In response thereto, the control unit 805 causes the radiation detector (any one of the electronic component 100 to the electronic component 100C) to generate a signal corresponding to the incident radiation.

In the radiation imaging apparatus according to the present embodiment and the radiation imaging system using the radiation imaging apparatus, even if the temperature of the radiation detector changes at the time of capturing an image, the electrical connection between the semiconductor substrate and the member including the peripheral circuit is not impaired by unbalanced thermal expansion or unbalanced thermal contraction of each unit. As a result, it is possible to realize a radiation imaging apparatus that is excellent in reliability and durability and capable of obtaining a high-quality radiation image, and the radiation imaging apparatus can be practically used in various fields including a medical field and an industrial field.

Fifth Embodiment

Figure 12:
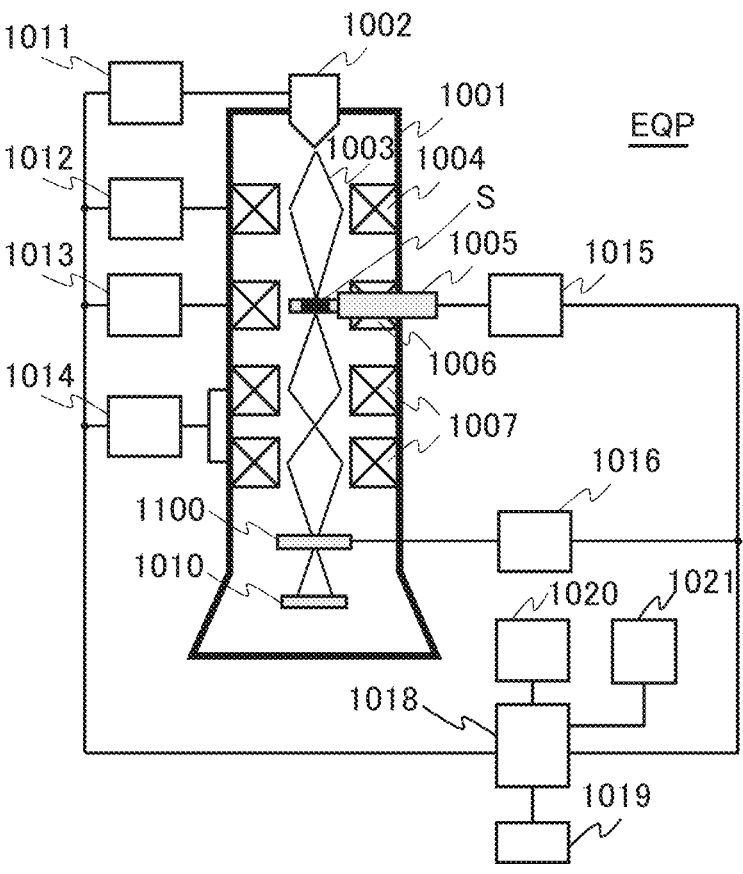
FIG. 12 is a diagram for explaining a transmission electron microscope system that is a radiation imaging system according to a fifth embodiment.

A transmission electron microscope (TEM) system will be described as an example of a radiation imaging system in which the radiation detector (electronic component) according to any one of the first to third embodiments described above is incorporated with reference to a schematic configuration diagram of FIG. 12. Equipment EQP serving as a transmission electron microscope includes an electron beam source 1002 (electron gun), an irradiation lens 1004, a vacuum chamber 1001 (lens barrel), an objective lens 1006, a magnifying lens system 1007, and a radiation detector 1100. The radiation detector 1100 is any one of the electronic components 100 to 100C described above.

An electron beam 1003, which is a radiation emitted from the electron beam source 1002 (electron gun) serving as a radiation source, is focused by the irradiation lens 1004 and is emitted to a sample S that is an analysis target held in a sample holder. A space through which the electron beam 1003 passes is defined by the vacuum chamber 1001 (lens barrel) included in the device EQP, and this space is held in a vacuum state.

The electron beam 1003 transmitted through the sample S is magnified by the objective lens 1006 and the magnifying lens system 1007, and an image thereof is formed on the light receiving surface of the radiation detector 1100. An electron optical system for irradiating the sample S with an electron beam is referred to as an irradiation optical system, and an electron optical system for forming an image of the electron beam transmitted through the sample S on the light receiving surface of the radiation detector 1100 is referred to as an imaging optical system.

The electron beam source 1002 is controlled by an electron beam source control device 1011. The irradiation lens 1004 is controlled by an irradiation lens control device 1012. The objective lens 1006 is controlled by an objective lens control device 1013. The magnifying lens system 1007 is controlled by a magnifying lens system control device 1014. A sample holder control mechanism 1005 is controlled by a holder control device 1015 that controls a sample holder drive mechanism.

The electron beam 1003 transmitted through the sample S is detected by the radiation detector 1100. The signal output from the radiation detector 1100 is processed by a signal processing device 1016 and an image processing device 1018 to generate an image signal. The generated image signal (transmission electron image) is displayed on an image display monitor 1020 and an analysis monitor 1021 serving as display devices.

Each of the electron beam source control device 1011, the irradiation lens control device 1012, the objective lens control device 1013, the magnifying lens system control device 1014, and the holder control device 1015 is connected to the image processing device 1018. As a result, data can be exchanged therebetween to set photographing conditions of the electron microscope. The conditions for controlling the drive of the sample holder and each lens for observing can be set according to a signal from the image processing device 1018.

An operator prepares a sample S to be photographed, and sets photographing conditions using the input device 1019 connected to the image processing device 1018. Predetermined data is input to each of the electron beam source control device 1011, the irradiation lens control device 1012, the objective lens control device 1013, and the magnifying lens system control device 1014, so that a desired acceleration voltage, a desired magnification, and a desired observation mode are obtained. In addition, the operator inputs conditions such as the number of continuous visual field images, a photographing start position, and a moving speed of the sample holder to the image processing device 1018 using the input device 1019 such as a mouse, a keyboard, or a touch panel. The image processing device 1018 may automatically set the conditions without depending on the operator's input.

Note that the electron microscope according to the present embodiment is not limited to the exemplified transmission electron microscope (TEM), and may be, for example, a scanning electron microscope (SEM) or a scanning transmission electron microscope (STEM). Furthermore, the electron microscope according to the present embodiment may be, for example, an electron microscope having a processing function such as an ion beam milling function or an ion beam induced deposition (IBID) function, or a dual-beam electron microscope having a focused ion beam (FIB) such as an FIB-SEM.

In the electron microscope according to the present embodiment, even if the temperature of the radiation detector changes at the time of capturing an image, the electrical connection between the semiconductor substrate and the member including the peripheral circuit is not impaired by unbalanced thermal expansion or unbalanced thermal contraction of each unit. As a result, it is possible to realize a radiation imaging apparatus that is excellent in reliability and durability and capable of obtaining a high-quality radiation image, and the radiation imaging apparatus can be practically used in various fields including a medical field and an industrial field.

Modification

Note that the present invention is not limited to the above-described embodiments, and many modifications can be made within the technical spirit of the present invention. For example, all or some of the different embodiments described above may be combined for implementation.

As an example, in the above-described embodiments, the first support member and the second support member are electrically connected to each other via the conductive member 50B, but the connection between the first support member and the second support member is not limited thereto. For example, the conductor layer 211 of the first support member and the conductor layer 311 of the second support member may be formed of Cu, and the conductor layer 211 of the first support member and the conductor layer 311 of the second support member may be directly bonded to each other by hybrid bonding of Cu therebetween to form a bonding portion.

In the illustrated embodiments, a side surface of the first support member on an inner side (detection region side) and a side surface of the second support member on an inner side (detection region side) are disposed on the same plane, but may not necessarily be disposed on the same plane. When seen through from a direction perpendicular to the main surface of the semiconductor substrate, it is sufficient that neither the first support member nor the second support member overlaps the detection region, and for example, the side surface of the first support member on the detection region side and the side surface of the second support member on the detection region side may form a discontinuous step. It is only needed that at least a partial portion of the third main surface of the first support member supports at least a partial portion of the second main surface of the semiconductor substrate, and at least a partial portion of the fifth main surface of the second support member supports at least a partial portion of the fourth main surface of the first support member.

In addition, the electronic component according to the embodiment is not limited to the radiation detector, and the present invention can be implemented as long as the electronic component has a semiconductor substrate having a small thickness supported by a support substrate and electrically connected to the support substrate. The semiconductor substrate thinned to 100 μm or less is not limited to a substrate including a radiation detection element, and may be a semiconductor substrate used for various purposes such as signal processing and high-speed calculation.

According to the present invention, concerning various electronic components each including a semiconductor substrate having a small thickness and a support member for securing the strength of the semiconductor substrate, it is possible to provide a technology capable of achieving both the securement of the strength of the semiconductor substrate and the reliability of the electrical bonding of the semiconductor substrate to a package.

Other Embodiments

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2023-113995, filed Jul. 11, 2023, which is hereby incorporated by reference herein in its entirety.

What is claimed is:

1. An electronic component comprising:
a semiconductor substrate having a first main surface and a second main surface;
a first support member having a third main surface and a fourth main surface, at least a partial portion of the third main surface supporting at least a partial portion of the second main surface of the semiconductor substrate; and
a second support member having a fifth main surface and a sixth main surface, at least a partial portion of the fifth main surface supporting at least a partial portion of the fourth main surface of the first support member,
wherein in a case where the electronic component is seen through from a direction perpendicular to the first main surface,
the semiconductor substrate has a first region and a second region adjoining an outer side of the first region,
the semiconductor substrate does not overlap any of the first support member and the second support member in the first region,
the semiconductor substrate overlaps both the first support member and the second support member in at least a partial portion of the second region,
a first connection part configured to electrically connect the semiconductor substrate and the first support member to each other and a second connection part configured to electrically connect the first support member and the second support member to each other are provided outside the first region, and
the first support member includes a through electrode configured to electrically connect the first connection part and the second connection part to each other.

2. The electronic component according to claim 1, wherein
the semiconductor substrate has a thickness of 100 μm or less in the first region.

3. The electronic component according to claim 1, wherein
the first support member has a thickness of 100 μm or more.

4. The electronic component according to claim 1, wherein
the first connection part includes a wire configured to connect a conductor layer provided on the first main surface of the semiconductor substrate and a conductor layer provided on the third main surface of the first support member.

5. The electronic component according to claim 4, wherein
the wire is covered with a resin.

6. The electronic component according to claim 1, wherein
the first connection part includes a conductive member configured to connect a conductor layer provided on the second main surface of the semiconductor substrate and a conductor layer provided on the third main surface of the first support member.

7. The electronic component according to claim 1, wherein
the first connection part includes a bonding portion in which a conductor layer provided on the second main surface of the semiconductor substrate and a conductor layer provided on the third main surface of the first support member are directly bonded to each other.

8. The electronic component according to claim 1, wherein
the second connection part includes a conductive member configured to connect a conductor layer provided on the fourth main surface of the first support member and a conductor layer provided on the fifth main surface of the second support member.

9. The electronic component according to claim 1, wherein
the second connection part includes a bonding portion in which a conductor layer provided on the fourth main surface of the first support member and a conductor layer provided on the fifth main surface of the second support member are directly bonded to each other.

10. The electronic component according to claim 1, wherein
a main component of the semiconductor substrate and a main component of the first support member are the same material, and the main component of the semiconductor substrate and a main component of the second support member are different materials.

11. A radiation detector comprising:
the electronic component according to claim 1,
wherein the semiconductor substrate includes a light receiving unit configured to receive a radiation in the first region.

12. The radiation detector according to claim 11, wherein
the semiconductor substrate includes a signal processing circuit around the light receiving unit.

13. A radiation imaging system comprising:
the radiation detector according to claim 11; and
a signal processing unit configured to process a signal output from the radiation detector.

14. A radiation imaging system comprising:
the radiation detector according to claim 11; and
a radiation source.

* * * * *